US007002225B2

(12) United States Patent
Stewart

(10) Patent No.: US 7,002,225 B2
(45) Date of Patent: Feb. 21, 2006

(54) COMPLIANT COMPONENT FOR SUPPORTING ELECTRICAL INTERFACE COMPONENT

(75) Inventor: Robert E. Stewart, Woodland Hills, CA (US)

(73) Assignee: Northrup Grumman Corporation, Woodland Hills, CA (US)

( * ) Notice: Subject to any disclaimer, the term of this patent is extended or adjusted under 35 U.S.C. 154(b) by 330 days.

(21) Appl. No.: 10/154,683

(22) Filed: May 24, 2002

(65) Prior Publication Data

US 2003/0220012 A1 Nov. 27, 2003

(51) Int. Cl.

| | |
|---|---|
| ***H01L 23/34*** | (2006.01) |
| ***H01L 21/48*** | (2006.01) |
| ***H01L 23/544*** | (2006.01) |
| ***H05K 7/06*** | (2006.01) |
| ***G01R 31/26*** | (2006.01) |

(52) U.S. Cl. ...................... 257/414; 257/415; 257/417; 257/774; 257/773; 257/775; 257/776; 257/781; 324/754; 324/761; 439/66; 439/70; 439/81; 438/117; 438/106; 438/49; 438/73; 73/DIG. 4; 73/514.32; 73/760; 73/514.34; 361/776; 361/768; 361/774; 361/769; 361/688; 29/852; 29/837; 29/840; 29/593; 29/831; 29/884

(58) Field of Classification Search ................ 257/781, 257/759, 776, 775, 747, 770, 414, 415, 417, 257/48, E23.065, E23.68; 361/776, 767, 361/768, 771, 772, 769, 688, 774; 324/754, 324/761; 438/73, 49

See application file for complete search history.

(56) References Cited

U.S. PATENT DOCUMENTS 5,116,462 A * 5/1992 Bartha et al. .................. 216/2
5,177,438 A * 1/1993 Littlebury et al. .......... 324/754
5,271,913 A * 12/1993 Iida et al. ................ 423/213.2
5,602,422 A * 2/1997 Schueller et al. ........... 257/738
5,811,982 A * 9/1998 Beaman et al. ............. 324/762
5,912,427 A * 6/1999 Willis et al. ............. 102/202.8
5,982,009 A * 11/1999 Hong et al. ................. 257/414

(Continued)

FOREIGN PATENT DOCUMENTS

EP 0 752 587 A2 * 1/1997

(Continued)

OTHER PUBLICATIONS

"MEMS"; http://www.techweb.com/encyclopedia/defineterm?term=MEMS&y=12; TechEncyclopedia; Computer Language Company, 5521 State Park Road, Point Pleasant, PA 18950; 1 pg.; May 20, 2002.

(Continued)

*Primary Examiner*—Alexander Oscar Williams
(74) *Attorney, Agent, or Firm*—Patti & Brill, LLC

(57) ABSTRACT

An apparatus in one example includes a compliant component for supporting an electrical interface component that serves to electrically and mechanically couple a die with a separate layer. In one example, the compliant component, upon relative movement between the die and the separate layer, serves to promote a decrease in stress in one or more of the die and the separate layer. The apparatus in another example includes a compliant component for supporting an electrical interface component that serves to create an electrical connection between a die and a separate layer. The compliant component, upon relative movement between the die and the separate layer, serves to promote maintenance of the electrical connection.

29 Claims, 6 Drawing Sheets

U.S. PATENT DOCUMENTS

| | | | | |
|---|---|---|---|---|
| 6,064,576 | A * | 5/2000 | Edwards et al. | 361/776 |
| 6,105,427 | A | 8/2000 | Stewart et al. | |
| 6,200,143 | B1 * | 3/2001 | Haba et al. | 439/70 |
| 6,202,297 | B1 * | 3/2001 | Faraci et al. | 29/837 |
| 6,211,572 | B1 * | 4/2001 | Fjelstad et al. | 257/781 |
| 6,232,143 | B1 * | 5/2001 | Maddix et al. | 438/100 |
| 6,565,392 | B1 | 5/2003 | Padro | |
| 6,664,131 | B1 * | 12/2003 | Jackson | 438/108 |
| 6,827,584 | B1 * | 12/2004 | Mathieu et al. | 439/66 |
| 6,847,114 | B1 * | 1/2005 | Sett et al. | 257/717 |

FOREIGN PATENT DOCUMENTS

| | | | |
|---|---|---|---|
| JP | 1-155633 | * 6/1989 | |
| JP | 1-301174 | * 12/1989 | 73/497 |

OTHER PUBLICATIONS

"die"; http://www.techweb.com/encyclopedia/defineterm?term=die; TechEncyclopedia; Computer Language Company, 5521 State Park Road, Point Pleasant, PA 18950; 1 pg.; May 24, 2002.

"Compliant"; http://www.dictionary.com/search?q=compliant; Lexico, LLC; Lexico, LLC, 13428 Maxella Avenue #236, Marina del Rey, CA 90292; 2 pgs.; May 24, 2002.

"mems"; http://www.techweb.com/encyclopedia/defineterm?term=MEMS&x=23&y=12; TechEncyclopedia; Computer Language Company, 5521 State Park Road, Point Pleasant, PA 18950; 1 pg.; May 20, 2002.

"Stress"; http://www.dictionary.com/search?q=stress; Lexico, LLC; Lexico, LLC, 13428 Maxella Avenue #236, Marina del Rey, CA 90292; 6 pgs.; May 24, 2002.

"flip chip technology"; http://www.seminiconductorglossary.com/default.asp?searchterm=flip+chip+technology; 1 pg.; May 20, 2002.

"Backplane"; http://www.maxmon.com/eb.htm; LLH Technology Publishing. Eagle Rock, VA USA; 1 pg.; May 20, 2002.

* cited by examiner

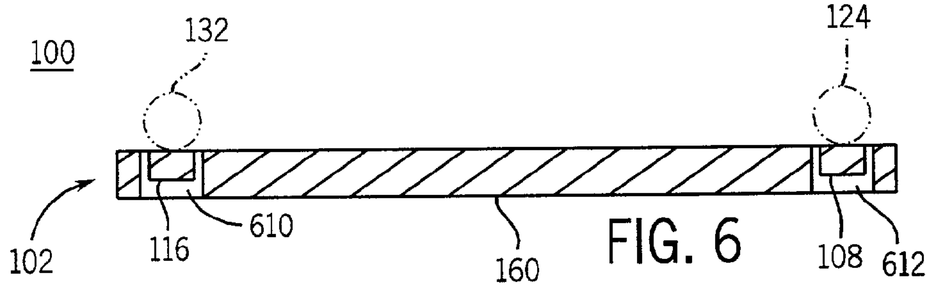
FIG. 6
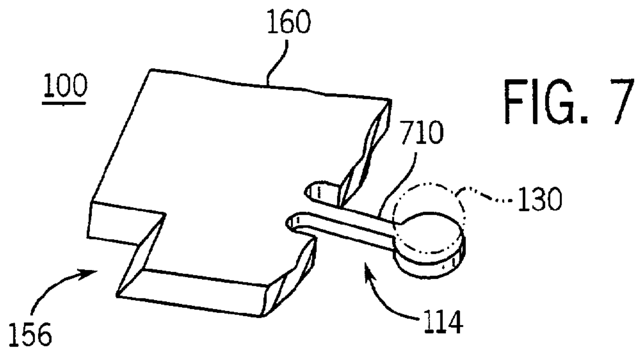
FIG. 7
FIG. 8
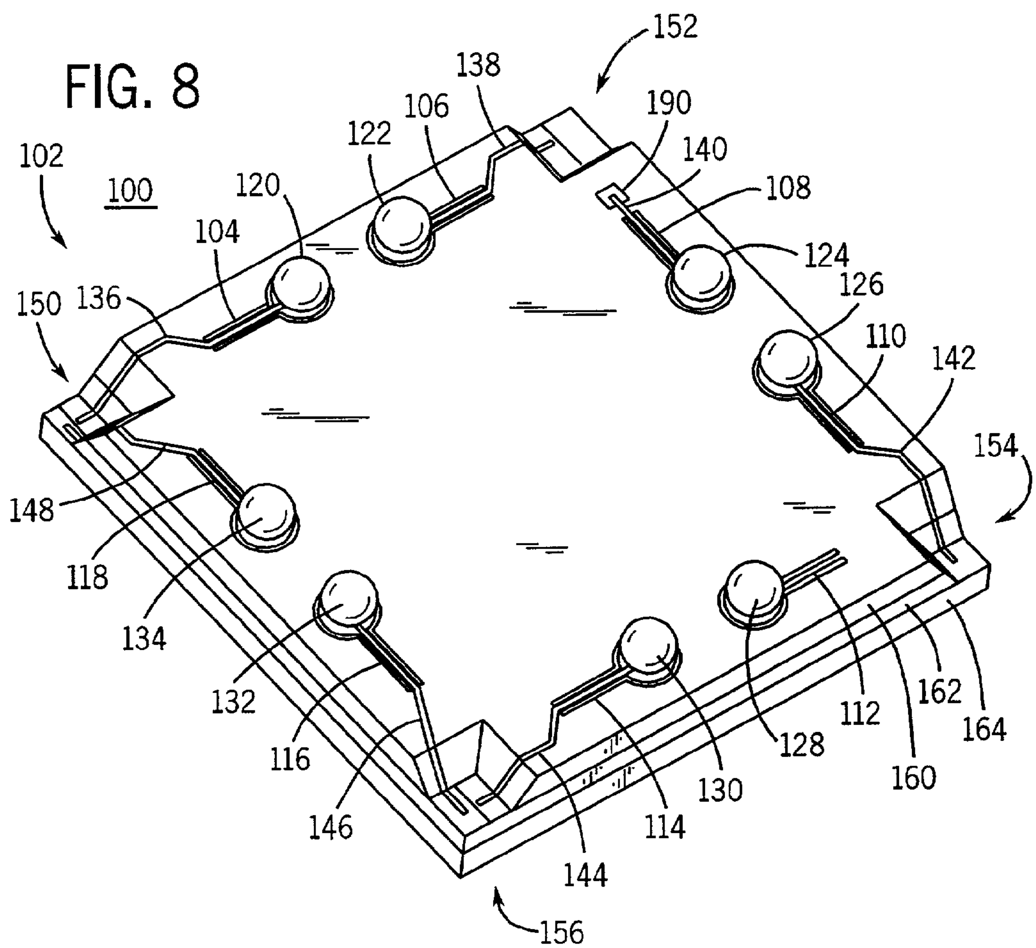

COMPLIANT COMPONENT FOR SUPPORTING ELECTRICAL INTERFACE COMPONENT

TECHNICAL FIELD

The invention in one example relates generally to electrical systems and more particularly to connection between parts in an electrical system.

BACKGROUND

A three dimensional die with multiple layers, as one example of an electrical circuit, requires electrical connections to the multiple layers. For example, wire bonds serve to provide the electrical connections between the layers. In some cases, the wire bonds must be made to contacts on both the top and bottom of the die. Having wire bond contacts on both the top and bottom of the die can result in the need to fabricate subassemblies with wire bonds wrapping around multiple sides of the die. Having wire bonds that wrap around multiple sides of a die makes the die difficult to package. Having wire bonds wrap around the die increases the periphery of the die. Having a larger periphery increases the space used by the die when the die is mounted to a substrate, circuit board, or the like. In addition, wire bonds are very thin and therefore susceptible to stress damage.

In another example, the die is packaged in a housing with electrical feed throughs. Wire bond contacts are made to electrical contacts on different layers of the die. These bond wires are then attached to feed throughs in the housing. The feed throughs in the housing allow for an interface with a substrate, circuit board, or the like. Creating the wire bonds and electrical feed through is complicated to assemble, expensive, and fragile.

In another example, the die has one or more layers. The die makes an electrical connection to a substrate, circuit board, or the like, of a different material than the die. Since the materials are different, they are likely to have different expansion/contraction coefficients. When expansion occurs in one or both of the materials, a stress is placed on the connection between the two materials. When the stress is large enough the connection can fail or break.

In another example, the die makes an electrical connection to a substrate, circuit board, or the like. When translational or rotational movement occurs a stress is placed on the connection between the die and the substrate, circuit board, or the like.

Thus, a need exists for a die that has increased durability in the interface between the die and a compatible structure. A need also exists for a die with decreased size. A need also exists for a die that is easier to electrically interface with compatible structures.

SUMMARY

The invention in one embodiment encompasses an apparatus. The apparatus includes a compliant component for supporting an electrical interface component that serves to electrically and mechanically couple a die with a separate layer. In one example, the compliant component, upon relative movement between the die and the separate layer, serves to promote a decrease in stress in one or more of the die and the separate layer.

The invention in another embodiment encompasses an apparatus. The apparatus includes a compliant component for supporting an electrical interface component that serves to create an electrical connection between a die and a separate layer. The compliant component, upon relative movement between the die and the separate layer, serves to promote maintenance of the electrical connection.

DESCRIPTION OF THE DRAWINGS

Features of exemplary implementations of the invention will become apparent from the description, the claims, and the accompanying drawings in which:

FIG. 6 is a sectional representation of the die directed along line 6—6 of FIG. 1.

FIG. 7 is one example of a compliant component of the apparatus of FIG. 1.

FIG. 8 is another example of the die of the apparatus of FIG. 1.

DETAILED DESCRIPTION

Figure 1:
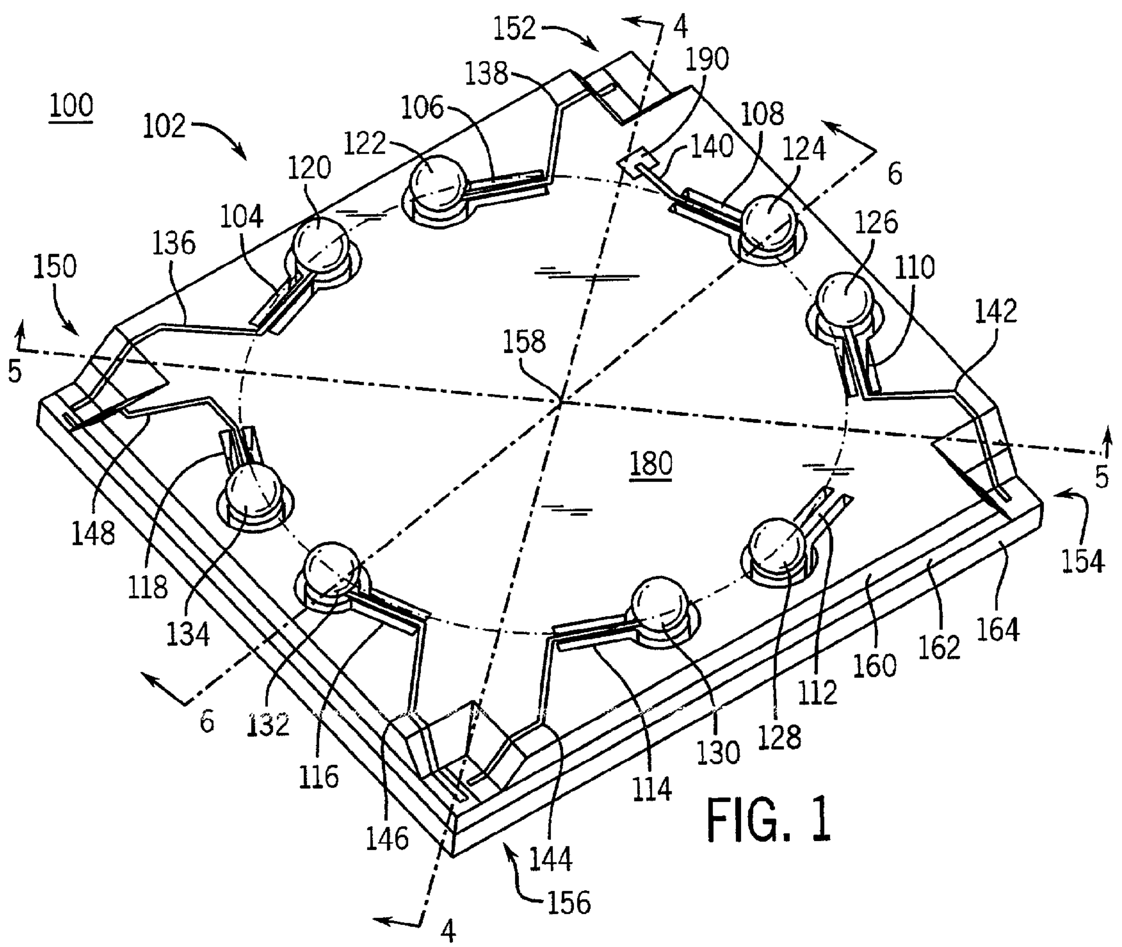
FIG. 1 is one example of an apparatus that includes a die that comprises one or more layers, one or more connection paths, one or more electrical contact locations, one or more electrical interface components, and one or more compliant components.
Figure 3:
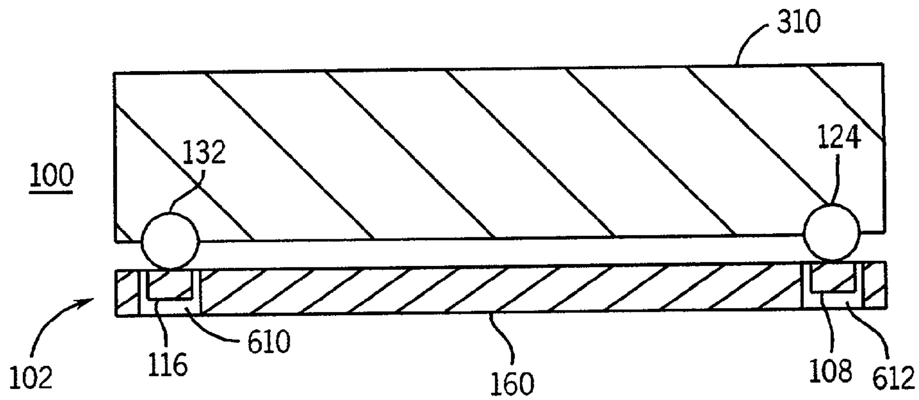
FIG. 3 is one example of an electrical connection between the die and a separate layer of the apparatus of FIG. 1.
Figure 2:
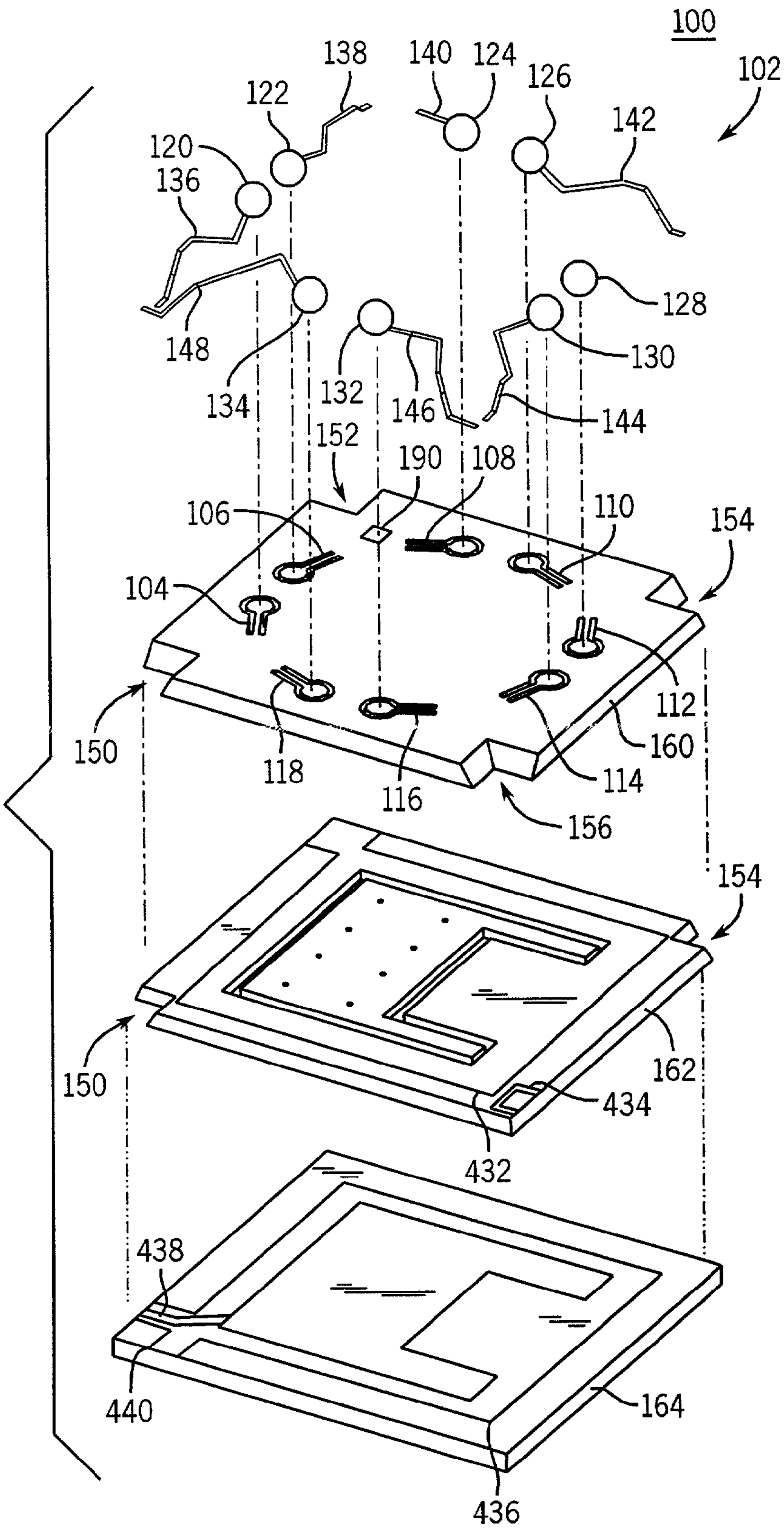
FIG. 2 is one exploded representation of the die of the apparatus of FIG. 1.

Turning to FIGS. 1–3, an apparatus 100 in one example comprises one or more dice 102 and one or more separate layers 310. The die 102 comprises, for example, a micro-electro-mechanical system ("MEMS"), sensor, actuator, accelerometer, switch, stress sensitive integrated circuit, or the like. The die 102 includes one or more layers 160, 162, and 164, one or more compliant components 104, 106, 108, 110, 112, 114, 116, and 118, one or more electrical interface components 120, 122, 124, 126, 128, 130, 132, and 134, and one or more connection paths 136, 138, 140, 142, 144, 146, and 148. The separate layer 310 in one example comprises a substrate, circuit board, electronic device, die, or the like.

Figure 4:
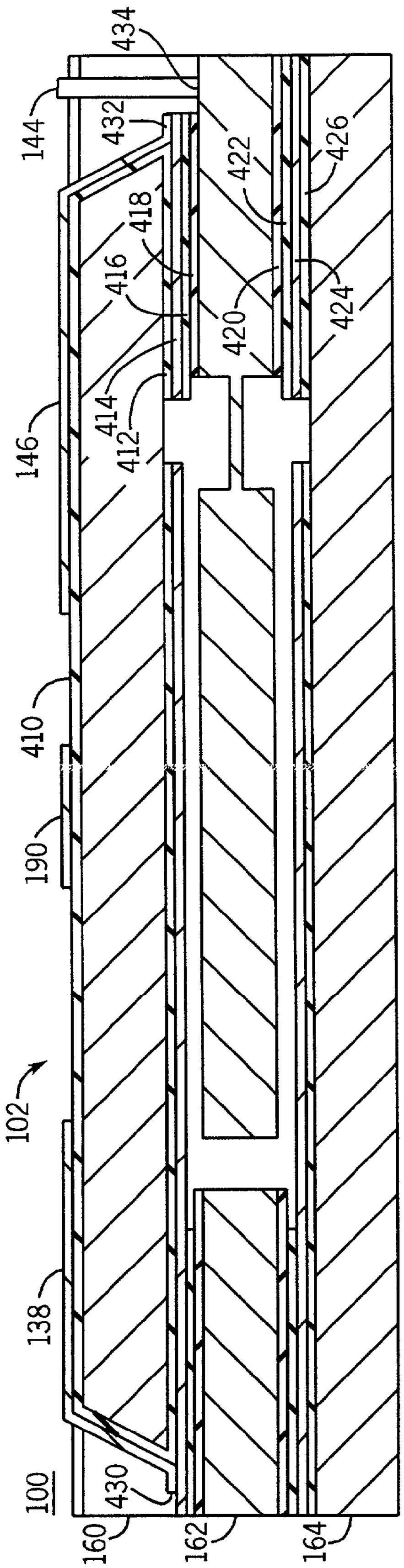
FIG. 4 is a sectional representation of the die directed along line 4—4 of FIG. 1.
Figure 5:
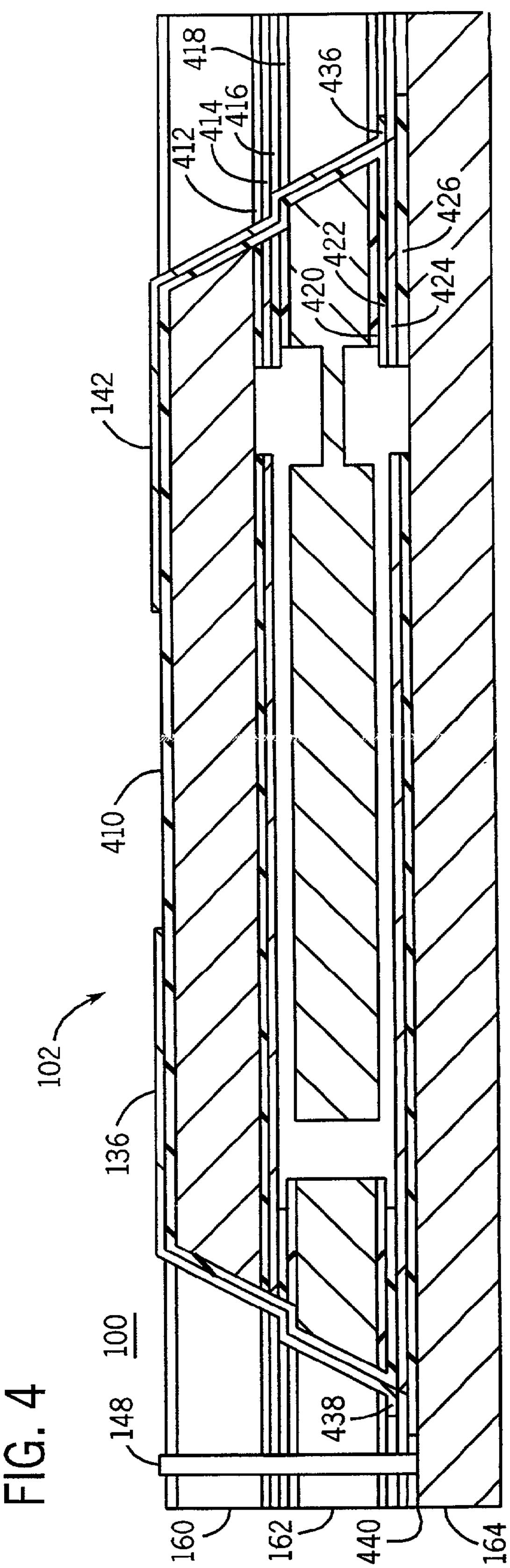
FIG. 5 is a sectional representation of the die directed along line 5—5 of FIG. 1.

Referring to FIGS. 4 and 5, the one or more layers 160, 162, and 164 in one example comprise, semiconductors, insulators, conductors, or the like.

Referring to FIG. 6 (a cross section 6—6 of FIG. 1), in one example, the compliant component 116 is located in an etched well 610 on the cover 160 of the die 102. The well 610 is a large enough size and shape to allow for the flexing of the compliant component 116. In another example, the compliant component 116 is on an interfacing surface 180 of the cover 160 of the die 102.

Referring to FIGS. 1 and 7, the compliant component 114 in one example comprises a flexible arm 710. The flexible arm 710 is attached both to the die 102 and the electrical interface component 130. In one example, the die 102 is etched in a pattern such that the arm 710 and the electrical interface component 130 have the space to be able to flex in response to stress applied to the flexible arm 710. In another example, the compliant component 114 is a beam that is micro machined into the die 102.

In one example, referring to FIG. 7, the compliant component 114 comprises a flexible arm 710. In one example, the flexible arm 710 and the cover 160, or the like, are etched from a single homogeneous material. In another example, the flexible arm 710 is etched from a separate homogeneous material as the cover 160, then attached to the cover 160, or the like. In another example, the flexible arm 710 is etched from a heterogeneous material as the cover 160, then attached to the cover 160, or the like.

In one example, the flexible arm 710 is a straight linear structure. In another example, the flexible arm 710 has one or more unstressed bends, curves, or the like. In another example, the flexible arm 710 is a plurality of flexible arms.

Figure 9:
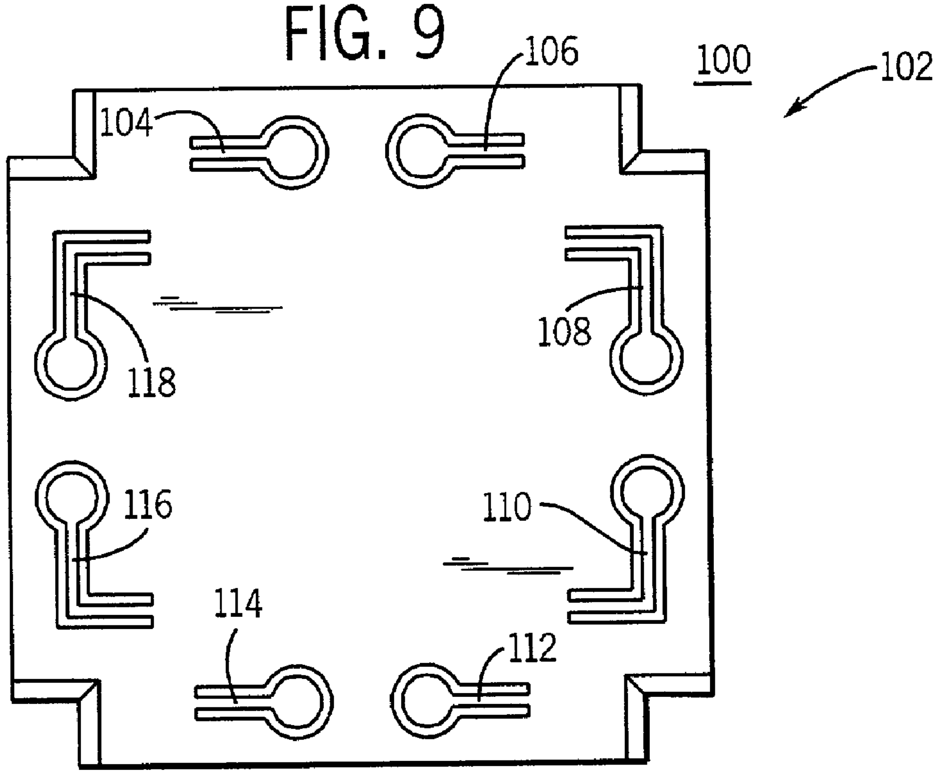
FIG. 9 is yet another example of the die of the apparatus of FIG. 1.

Referring to FIG. 9, in one example a subset of the compliant components 108, 110, 116, and 118 are designed to be compliant to translational movement in a single direction as well as being compliant with the direction of movement due to expansion. In one example, the translational movement in a single direction is horizontal on the die 102 plane. In another example, the translational movement in a single direction is vertical on the die 102 plane. The compliant component 104, 106, 108, 110, 112, 114, 116, and 118 orientation of FIG. 9 allows the overall connection of the die 102 to the separate layer 310 to be compliant to translational movement in a single direction as well as being compliant with the direction of movement due to expansion.

Figure 10:
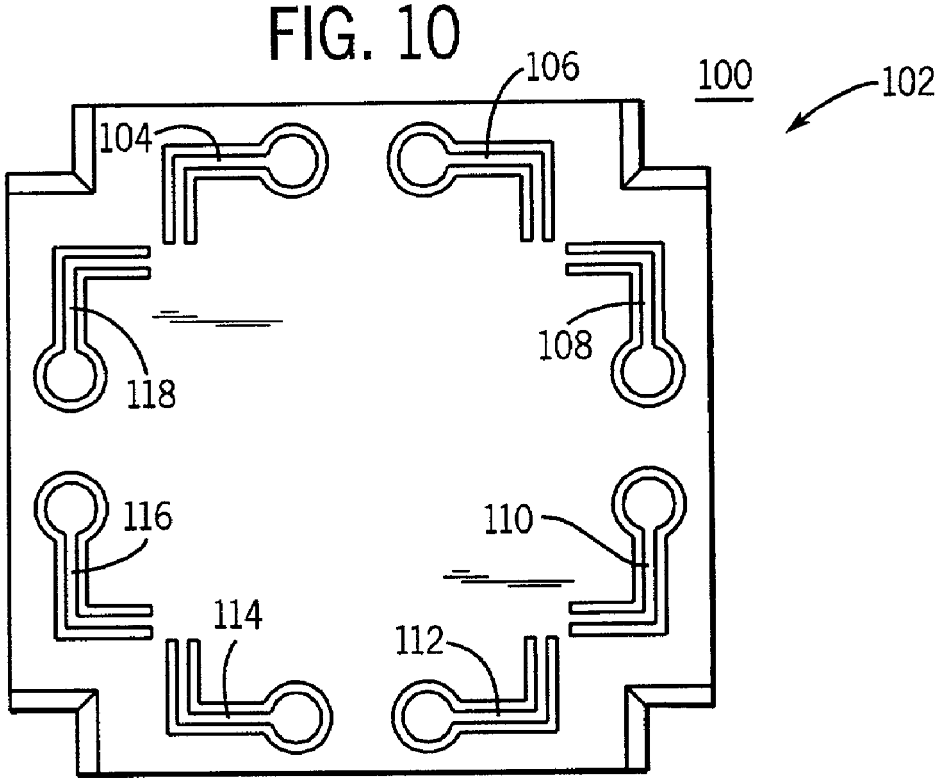
FIG. 10 is a further example of the die of the apparatus of FIG. 1.

Referring to FIG. 10, in one example a first subset of the compliant components 108, 110, 116, and 118 are designed to be compliant to translational movement in a first direction as well as being compliant with the direction of movement due to expansion. A second subset of the compliant components 104, 106, 112, and 114 are designed to be compliant to translational movement in a second direction as well as being compliant with the direction of movement due to expansion. In one example, the first direction is different from that of the second direction in the plane of the die 102. The compliant component 104, 106, 108, 110, 112, 114, 116, and 118 orientation of FIG. 10 allows the overall connection of the die 102 to the separate layer 310 to be compliant to translational movement in multiple directions, compliant to rotation, as well as being compliant with the direction of movement due to expansion. In one example, the translational movement is horizontal on the die 102 plane. In another example, the translational movement is vertical on the die 102 plane. In another example, the translational movement is vertical and horizontal on the die 102 plane. A die 102 connection compliant to translational, rotational, and expansion movements has a use in applications that are, in one example, counter balanced mechanical resonators. The resonators have one or more masses vibrating out of phase with each other. In one example, the masses need to vibrate at a same frequency. When used in such an application the compliant mounting structures 104, 106, 108, 110, 112, 114, 116, and 118 that allow translational, rotational, and expansion movements will couple the two masses together so they vibrate at the same frequency.

The electrical interface component 130, in one example is a conductive pad, or the like. In another example, the electrical interface component 130 is a solder ball, or the like. In another example, the electrical interface component 130 is a solder ball, or the like, connected to a conductive pad, or the like. The electrical interface component 130 is electrically insulated from the die 102.

In one example, the connection path 144 is a signal routing trace. The connection path 144 is used to pass the electrical signal from one of the one or more layers 160, 162, and 164 to the electrical interface component 130 on the interfacing surface 180.

In one example, a connection between the die 102 and the separated layer 310 can be accomplished by using one or more of flip chip technology, ball grid array technology, and pad grid array technology. Ball grid arrays are external connections that are arranged as an array of conducting pads on the interfacing surface 180 of the die 102. For explanatory purposes, the figures represent one example of the apparatus 100 that employs exemplary ball grid array technology. An electrical connection between a layer contact 190, 430, 432, 434, 436, 438, and 440, and the electrical interface component 120, 122, 124, 126, 130, 132, and 134 is made through the connection path 136, 138, 140, 142, 144, 146, and 148. In one example, one or more of the electrical interface components 128 are not used to electrically interface the die 102 to the separate layer 310. In one example, the electrical interface component 128 is extra for the specific example of the die 102. In another example, the electrical interface component 128 is intended to accommodate a possible future increase in the number of layer contacts 190, 430, 432, 434, 436, 438, and 440 in the die 102.

Referring to FIGS. 1, 3, 4 and 5, in one example each of the layers 160, 162, and 164, of a die 102, requiring an electrical connection to the separate layer 310 brings its connection to the interfacing surface 180 for interface with the separate layer 310. In one example, to access the various layers 160, 162, and 164 of the die 102, one or more notches 150, 152, 154, and 156 are created in the die 102.

In one example, the notch 156 could be a hole, cutout, path, window, opening and/or the like. The notch 156 can be at any location on the die 102. The notch 156 can be designed to reach any or all levels and/or depths. One or more layer contacts 430, 432, 434, 436, 438, and 440 can be reached through the same notch 156. Each of the notches 150, 152, 154, and 156 can be a different size, shape, or depth than any other of the notches 150, 152, 154, and 156.

Figure 11:
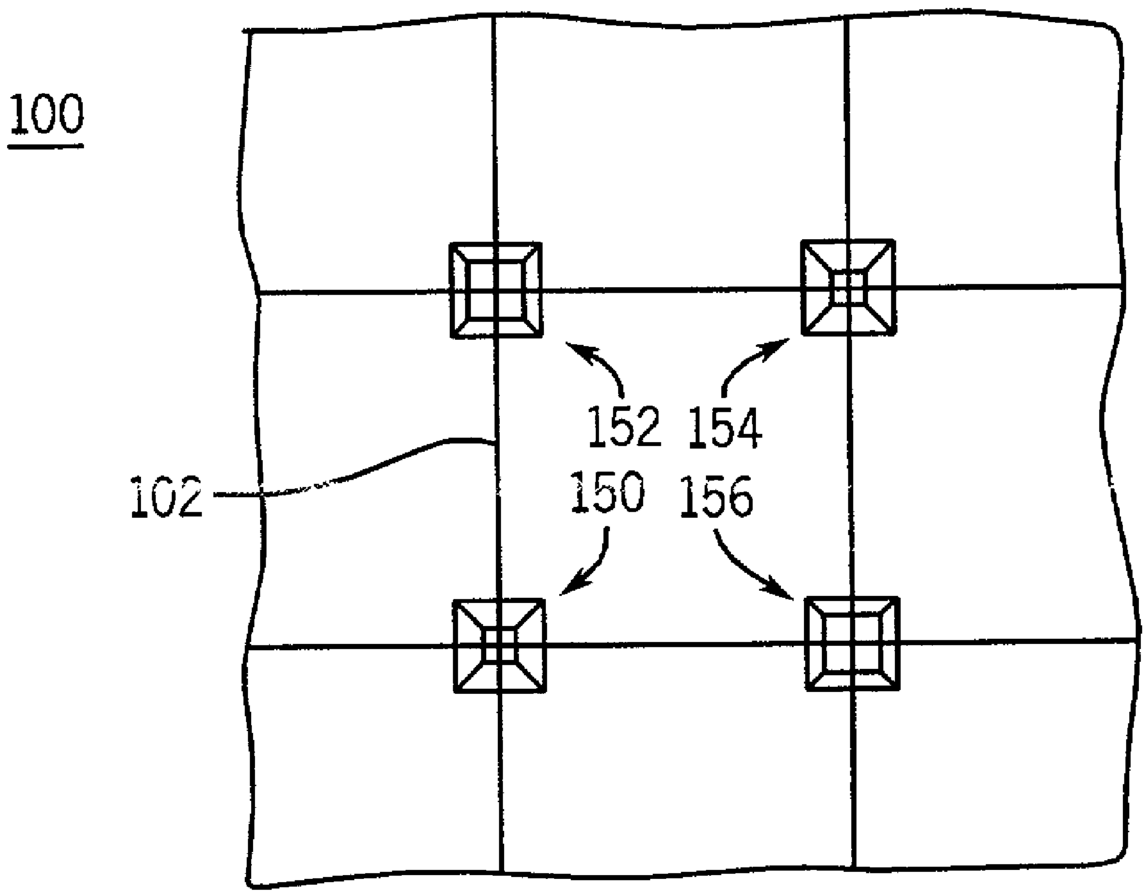
FIG. 11 is one example of a wafer fabrication pattern of the die of the apparatus of FIG. 1.

Referring to FIG. 11, the notch 156 is etched at the wafer level in order to take advantage of batch processing. In one example, the notches 150, 152, 154, and 156 are etched on the wafer to be a consistent size and depth. In one example, the notches 150, 152, 154, and 156 are etched on the wafer to be different sizes and depths. In one example, the etch could be an anisotropic wet etch. In another example, the etch could be a dry reactive ion etch, or the like.

Referring to FIGS. 1–5, the layer contact 434 connection is brought to the interfacing surface 180 by using a connection path 144. The connection path 144 uses the notch 156 to reach the respective die 102 layer contact 434. An insulator 410 is used to separate the connection path 144 from layer 160 and the other layer contacts 190, 430, 432, 436, 438, and 440. In one example, the insulator 410 is a silicon dioxide dielectric insulation layer.

In one example, the die 102 has one or more layer contacts 430, 432, 434, 436, 438, and 440 that are located on a different layer 162 and 164 than the layer 160 being used for interfacing to the separate layer 310. Each layer 160, 162, and 164 may have more than one layer contact 190, 430, 432, 434, 436, 438, and 440. An insulator 412, 416, 418, 420, 422, and 426 is used to separate each layer 160, 162, and 164 from the layer contacts 190, 430, 432, 434, 436, 438, and 440 of the other layers 160, 162, and 164, and the other layers 160, 162, and 164 themselves. In one example, the insulator 412, 416, 418, 420, 422, and 426 is a silicon dioxide dielectric insulation layer.

In one example, the die 102 and the separate layer 310 may not be the same material, and therefore may not have the same expansion coefficients. When the die 102 and the separate layer 310 are connected together and thermal changes, or any other expansion/contraction force, occur the die 102 will expand/contract by one amount and the separate layer 310 expands/contracts by another amount, different from that of the amount of the die 102. When the amount of expansion/contraction is different in the die 102 than in the separate layer 310, there will be a stress applied at the connection of the die 102 and the separate layer 310. This stress is relieved at the connection between the die 102 and the separate layer 310 by the flexing of the compliant component 114.

In one example, as shown in FIGS. 1, 7, and 8, the stress applied to the connection is likely to be in a radial direction from/to the midpoint 158 of the die 102 to/from the electrical interface component 130. In one example, the flexible arm 710 attached to the electrical interface component 130, is oriented perpendicular to the radial axis. When the stress is likely to be in a radial direction this perpendicular flexible arm 710 orientation provides a unstressed starting point for the electrical interface component 130. This unstressed starting point provides a wide range of motion in either radial direction. In another example, as shown in FIG. 8, the flexible arm 710 attached to the electrical interface component 130, is oriented parallel to one or more of the die 102 edges.

Referring to FIGS. 4 and 5, in one example, the die 102 is a sensor system. The die 102 has three element layers, a top cover 160, bottom cover 164, and a sensing center element 162. Each element layer 160, 162, and 164 has corresponding of the insulators 412, 418, 420, and 426 added to each surface that will be bonded to another surface. A conducting material 414 and 424 is laid down on the corresponding of the insulators 412 and 426 of each of the top cover 160 and the bottom cover 164 on the surface that is adjacent to the center element 162. The insulators 416 and 422 are laid down over the conducting materials 414 and 424. The three element layers 160, 162, and 164 are bonded together.

In one example, a plurality of layer contacts 430, 432, 434, 436, 438, and 440 are buried between the layers 160, 162, and 164 of the die 102. The layer contacts 430, 432, 434, 436, 438, and 440 are required to be on the interfacing surface 180 for the die 102 to be mounted directly to the separate layer 310, such as a substrate or circuit board. The interfacing surface 180 has a plurality of electrical interfacing components 120, 122, 124, 126, 128, 130, 132, and 134. Notches 150, 152, 154, and 156 are made through the die 102 to expose the buried layer contacts 430, 432, 434, 436, 438, and 440. Along the walls of the notch 156 the insulator 410 is applied to separate the connection path 144 from the element layers 160, 162, and 164 and the other layer contacts 430, 432, 436, 438, and 440. The desired layer contact 434 will not be covered by the insulator 410 to allow connection between the layer contact 434 and the connection path 144. The connection path 144 is used to pass the electrical signal from the layer contact 434 to the electrical interface component 130 on the interfacing surface 180. In one example, the connection path 144 is a signal routing trace. The electrical interface component 130 on the interfacing surface 180 is attached to compliant component 114. The compliant component 114 allows the die 102 to directly connect to the separate layer 310 with the same expansion properties or the separate layer 310 with different expansion properties.

One or more features described herein with respect to one or more of the compliant components 104, 106, 108, 110, 112, 114, 116, and 118 in one example apply analogously to one or more other of the compliant components 104, 106, 108, 110, 112, 114, 116, and 118. One or more features described herein with respect to one or more of the electrical interface components 120, 122, 124, 126, 128, 130, 132, and 134 in one example apply analogously to one or more other of the electrical interface components 120, 122, 124, 126, 128, 130, 132, and 134. One or more features described herein with respect to one or more of the connection paths 136, 138, 140, 142, 144, 146, and 148 in one example apply analogously to one or more other of the connection paths 136, 138, 140, 142, 144, 146, and 148. One or more features described herein with respect to one or more of the notches 150, 152, 154, and 156 in one example apply analogously to one or more other of the notches 150, 152, 154, and 156.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:

a compliant cantilever component for supporting an electrical interface component that serves to electrically and mechanically couple a die with a separate layer;

wherein the electrical interface component is located on an interface surface of the die, and an electrical contact is located on a second surface, wherein a connection path electrically couples the electrical interface component to the electrical contact;

wherein the compliant cantilever component is located in a recess in the interface surface of the die, wherein the recess provides space for movement of the compliant cantilever component; and wherein the compliant cantilever component, upon relative movement between the die and the separate layer, serves to promote a decrease in stress in one or more of the die and the separate layer.

2. The apparatus of claim 1, wherein the connection path communicates a signal from the electrical contact intended for the separate layer to the electrical interface component, wherein the electrical interface component communicates the signal to the separate layer.

3. The apparatus of claim 1, wherein the compliant component comprises a cantilever component, wherein the cantilever component and a portion of the die comprise a unitary construction and/or integral formation.

4. The apparatus of claim 1, wherein the compliant component comprises a cantilever component, wherein the cantilever component comprises a different material than the die, wherein the cantilever component is attached to the die.

5. The apparatus of claim 1, wherein the die comprises a center, wherein the die comprises a radius between the center of the die and the electrical interface component;

wherein the compliant component comprises a cantilever component, wherein the cantilever component is substantially perpendicular to the radius of the die.

6. The apparatus of claim 5, wherein the relative movement comprises a relative expansion, wherein upon the relative expansion between the die and the separate layer along the radius the cantilever component accommodates the relative expansion, wherein the cantilever component deforms to decrease the stress in one or more of the die and the separate layer.

7. The apparatus of claim 1, wherein the compliant component comprises a cantilever component, wherein the cantilever component comprises a first portion and a second portion.

8. The apparatus of claim 7, wherein the first portion is substantially perpendicular to the second portion.

9. The apparatus of claim 7, wherein the relative movement comprises a relative translation movement, wherein upon the relative translation movement between the die and the separate layer along a first general direction the cantilever component accommodates the relative translation movement between the die and the separate layer;

wherein the first portion deforms to decrease the stress in one or more of the die and the separate layer.

10. The apparatus of claim 9, wherein the first portion is connected directly to an interface surface of the die, wherein the second portion is connected to the interface surface through the first portion.

11. The apparatus of claim 9, wherein the second portion is connected directly to an interface surface of the die, wherein the first portion is connected to the interface surface through the second portion.

12. The apparatus of claim 9, wherein the relative translation movement comprises a vibrating frequency.

13. The apparatus of claim 9, wherein the relative translation movement comprises a first relative translation movement, wherein the cantilever component accommodates a second relative translation movement between the die and the separate layer in a second general direction.

14. The apparatus of claim 13, wherein the second portion deforms to decrease the stress in one or more of the die and the separate layer.

15. The apparatus of claim 14, wherein the second portion is connected directly to an interface surface of the die, wherein the first portion is connected to the interface surface through the second portion.

16. The apparatus of claim 14, wherein the first portion is connected directly to an interface surface of the die, wherein the second portion is connected to the interface surface through the first portion.

17. The apparatus of claim 14, wherein the second relative translation movement comprises a vibrating frequency.

18. The apparatus of claim 1, wherein the compliant component comprises a cantilever component, wherein the relative movement comprises a relative rotation, wherein upon the relative rotation between the die and the separate layer about an axis of the die the cantilever component accommodates the relative rotation, wherein the cantilever component deforms to decrease the stress in one or more of the die and the separate layer.

19. The apparatus of claim 1, wherein the electrical interface component comprises a first ball grid array contact and the separate layer comprises a second ball grid array contact, wherein the first ball grid array and the second ball grid array contact comprise a mating connection.

20. The apparatus of claim 1, wherein the die comprises a micro electro mechanical system.

21. The apparatus of claim 20, wherein the micro electro mechanical system comprises an accelerometer.

22. The apparatus of claim 20, wherein the micro electro mechanical system comprises a sensor.

23. The apparatus of claim 1, wherein the separate layer comprises one or more of a substrate and a circuit board.

24. The apparatus of claim 1, wherein the electrical interface component is mounted to the compliant component, wherein the electrical interface component directly abuts one or more contacts on the separate layer.

25. A method, comprising the steps of:

providing a compliant cantilever component for supporting an electrical interface component that serves to electrically and mechanically couple a die with a separate layer;

positioning the electrical interface component on an interface surface of the die;

positioning the electrical contact on a second surface, wherein a connection path electrically couples the electrical interface component to the electrical contact;

disposing the compliant cantilever component in a recess in the interface surface of the die, wherein the recess provides space for movement of the cantilever component; and accommodating a relative movement between the die and the separate layer through a flexible movement of the compliant cantilever component of the die.

26. The method of claim 25, wherein the step of accommodating the relative movement between the die and the separate layer through the flexible movement of the compliant component of the die comprises the step of:

accommodating a relative expansion between the die and the separate layer.

27. The method of claim 25, wherein the step of accommodating the relative movement between the die and the separate layer through the flexible movement of the compliant component of the die comprises the step of:

accommodating a relative translation movement between the die and the separate layer.

28. The method of claim 25, wherein the step of accommodating the relative movement between the die and the separate layer through the flexible movement of the compliant component of the die comprises the step of:

accommodating a relative rotation between the die and the separate layer.

29. The apparatus of claim 1, wherein the compliant component comprises a cantilever component, wherein the relative movement comprises a relative expansion;

wherein upon the relative expansion between the die and the separate layer the cantilever component accommodates the relative expansion, wherein the cantilever component deforms to decrease the stress in one or more of the die and the separate layer.

* * * * *